(12) United States Patent
Eldridge et al.

(10) Patent No.: US 9,548,594 B1
(45) Date of Patent: Jan. 17, 2017

(54) ELECTRONIC DEVICE AND LOAD CENTER INCLUDING THE SAME

(71) Applicant: EATON CORPORATION, Cleveland, OH (US)

(72) Inventors: David Austin Eldridge, Knoxville, TN (US); Maximilian Abel Mueller, Knoxville, TN (US); Ronald Lee Thompson, Knoxville, TN (US)

(73) Assignee: EATON CORPORATION, Cleveland, OH (US)

( * ) Notice: Subject to any disclaimer, the term of this patent is extended or adjusted under 35 U.S.C. 154(b) by 0 days.

(21) Appl. No.: 14/808,045

(22) Filed: Jul. 24, 2015

(51) Int. Cl.
*H02B 1/04* (2006.01)
*H04W 4/00* (2009.01)
*H05K 7/02* (2006.01)
*H02B 1/24* (2006.01)
*H04M 1/725* (2006.01)

(52) U.S. Cl.
CPC ........ *H02B 1/04* (2013.01); *H02B 1/24* (2013.01); *H04M 1/72527* (2013.01); *H04W 4/008* (2013.01); *H05K 7/02* (2013.01)

(58) Field of Classification Search
CPC ............ H02B 1/04; H02B 1/24; H04W 4/008; H05K 7/02; H04M 1/72527
USPC .................................................. 361/600–678
See application file for complete search history.

(56) References Cited

U.S. PATENT DOCUMENTS

| 2007/0064377 A1* | 3/2007 | DeBoer | H02J 13/0062 361/637 |
| 2013/0261821 A1* | 10/2013 | Lu | H04L 12/2807 700/289 |
| 2013/0329331 A1* | 12/2013 | Erger | H02H 1/0084 361/102 |
| 2014/0211345 A1* | 7/2014 | Thompson | B60L 11/1816 361/42 |
| 2016/0225562 A1* | 8/2016 | Franks | H02H 3/006 |

* cited by examiner

*Primary Examiner* — Anthony Haughton
*Assistant Examiner* — Yahya Ahmad
(74) *Attorney, Agent, or Firm* — Eckert Seamans; Nathaniel Wilks; Grant Coffield (57) ABSTRACT

An electronic device includes a housing defining an exterior shape of the electronic device, a processor, a power supply structured to receive line power and to convert the line power for use by the electronic device, a storage unit structured to store data, and a number of data interfaces structured to receive a data connection. The electronic device has a particular form factor that is compatible with positions in a circuit breaker receiving area of a load center. The electronic device is structured to provide the functionality of at least one of a set-top box, a network data interface, a telephone base station, a security system hub and a home controller.

19 Claims, 5 Drawing Sheets

ELECTRONIC DEVICE AND LOAD CENTER INCLUDING THE SAME

BACKGROUND

Field

The disclosed concept relates generally to electronic devices, and more particularly, to electronic devices installed in load centers. The disclosed concept also relates to load centers.

Background Information

Load centers or panel boards are generally a central interface point for power distribution to a premise (e.g., building; residence). Load centers receive and/or send utility power through a main feed, main breaker, main lugs, backfed circuit breaker etc. The utility power is then distributed out to various branch circuits via circuit breakers installed in the load center.

The circuit breakers are installed into position (e.g., without limitation, slots) in the load center. The positions are compatible with a particular form factor. Only circuit breakers having the form factor that is compatible with the positions may be installed into the positions in the load center.

While load centers are the central interface point for power distribution at a premise, the premise likely receives many other utilities such as cable and telephone service. However, these other utilities are not routed through the load center. The functionality of prior load centers has been limited to dealing with power distribution.

There is thus room for improvement in load centers. There is also room for improvement in electronic devices included in load centers.

SUMMARY

These needs and others are met by embodiments of the disclosed concept, which are directed to electronic devices that provide the functionality of at least one of a set-top box, a network router, a telephone base station, a security system hub and a home controller and have a form factor compatible with positions in a load center.

In accordance with aspects of the disclosed concept, an electronic device comprises: a housing defining an exterior shape of the electronic device; a processor; a power supply structured to receive line power and to convert the line power for use by the electronic device; a storage unit structured to store data; and a number of data interfaces structured to receive a data connection, wherein the electronic device has a particular form factor that is compatible with positions in a circuit breaker receiving area of a load center, and wherein the electronic device is structured to provide the functionality of at least one of a set-top box, a network data interface, a telephone base station, a security system hub and a home controller.

In accordance with other aspects of the disclosed concept, a load center comprises: a circuit breaker receiving area including a number of positions structured to be compatible with devices having a particular form factor; and a number of electronic devices having the particular form factor and being installed in at least one of the number of positions, wherein each of the electronic devices provide functionality of at least one of a set-top box, a network data interface, a telephone base station, a security system hub and a home controller.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Directional phrases used herein, such as, for example, left, right, front, back, top, bottom and derivatives thereof, relate to the orientation of the elements shown in the drawings and are not limiting upon the claims unless expressly recited therein.

As employed herein, the term "form factor" refers to the compatibility of an electronic device such as, without limitation, a circuit breaker (e.g., a miniature circuit breaker) with a position in a load center. That is, load centers may have positions compatible with a particular form factor and electronic devices having that particular form factor will be able to be installed in those positions. Exterior shape may play a significant role in determining the form factor of an electronic device. Electronic devices having the same exterior shape will generally have the same form factor. However, it will be appreciated by those having ordinary skill in the art that some variations in the exterior shape of an electronic device may be made without changing its form factor. For example and without limitations, variations to the exterior shape that do not affect the compatibility of an electronic device with the position in the load center may be made without affecting its form factor.

As employed herein, the term "processor" shall mean a programmable analog and/or digital device that can store, retrieve and process data; a controller; a control circuit; a computer; a workstation; a personal computer; a microprocessor; a microcontroller; a microcomputer; a central processing unit; a mainframe computer; a mini-computer; a server; a networked processor; or any suitable processing device or apparatus.

As employed herein, the term "number" shall mean one or an integer greater than one (i.e., a plurality).

Figure 1:
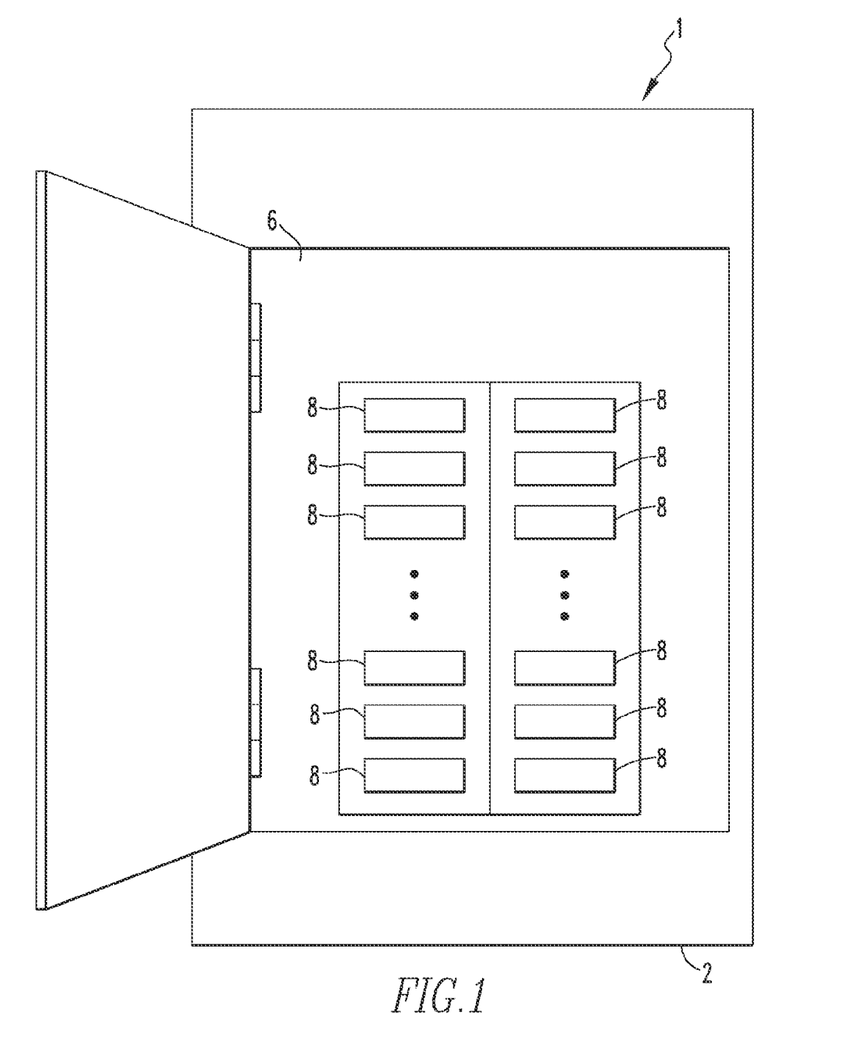
FIG. 1 is a schematic diagram of a load center in accordance with an example embodiment of the disclosed concept.

FIG. 1 is a schematic diagram of a load center 1 in accordance with an example embodiment of the disclosed concept. The load center 1 includes a housing 2 including a circuit breaker receiving area 6. The circuit breaker receiving area 6 includes a number of positions 8. The positions 8 are compatible with a particular form factor. That is, only circuit breakers or other electronic devices having the specific form factor corresponding to the shape of the positions 8 may be installed in the positions 8. For example and without limitation, if the positions 8 are compatible with the form factor of a 1-inch per pole UL-489 listed miniature circuit breaker, only 1-inch per pole miniature circuit breakers or other electronic devices having substantially the same form factor as 1-inch per pole miniature circuit breakers may be installed in the positions 8.

The other electronic devices may extend the functionality of the load center 1 beyond power distribution. While utility power is routed through the circuit breakers, data such as, without limitation, television data, internet data, phone data, or any other suitable type of data is routed through the electronic devices. Electronic devices in accordance with example embodiments of the disclosed concept will be described in more detail with respect to FIGS. 3-7.

Figure 2:
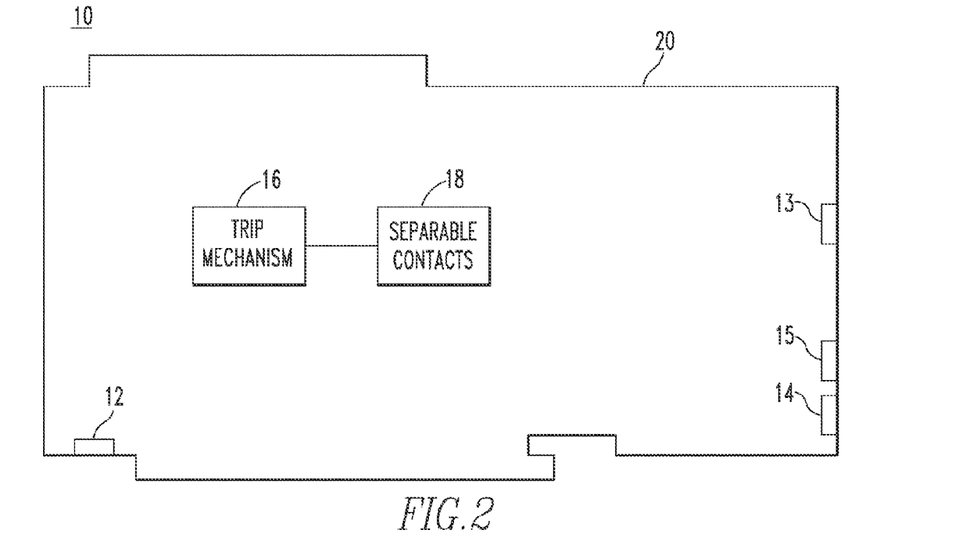
FIG. 2 is a schematic diagram of a circuit breaker in accordance with an example embodiment of the disclosed concept.

FIG. 2 is a schematic diagram of a circuit breaker 10 in accordance with an example embodiment of the disclosed concept. The circuit breaker 10 includes a line power interface 12 structured to electrically connect to a power source (e.g., without limitation, LINE power) via a busbar or other suitable electrical connection mechanism. The circuit breaker 10 also includes a load power interface 15 structured to electrically connect to a load. The circuit breaker 10 further includes a panel neutral interface 14 structured to electrically connect to a neutral or a ground at a panel or load center and a load neutral interface 15 structured to electrically connect to a load.

The circuit breaker 10 additionally includes a trip mechanism 16 and separable contacts 18. The separable contacts 18 are electrically connected between the line power interface 12 and the load power interface 13. When the separable contacts 18 are closed, the line power interface 12 and the load power interface 13 are electrically connected. However, opening the separable contacts 18 electrically disconnects the line power interface 12 from the load power interface 13.

The trip mechanism 16 is structured to monitor for trip conditions at the circuit breaker 10 such as, for example and without limitation, an overcurrent fault, an arc fault, a ground fault, etc. The trip mechanism 16 is structured to open the separable contacts 18 in response to detecting a trip condition. It is contemplated that any suitable trip mechanism 16 may be employed such as, for example and without limitation, a thermal and/or magnetic trip mechanism or an electronic trip unit.

The circuit breaker 10 has a housing 20 that substantially defines the exterior shape of the circuit breaker 10 and its form factor. The form factor of the circuit breaker 10 may be a particular form factor that is compatible with the positions 8 of the load center 1 of FIG. 1. Although one example of a particular form factor is shown, it will be appreciated that circuit breakers having any suitable form factor may be employed without departing from the scope of the disclosed concept.

Figure 3:
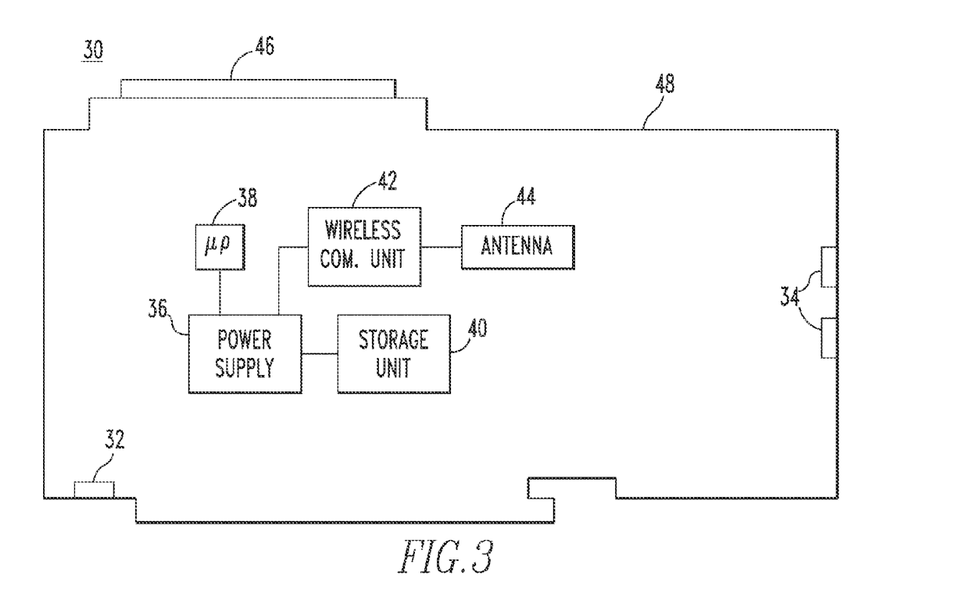
FIGS. 3-7 are schematic diagrams of electronic devices in accordance with example embodiments of the disclosed concept.

FIG. 3 is a schematic diagram of an electronic device 30 in accordance with an example embodiment of the disclosed concept. The electronic device 30 of FIG. 3 is structured to provide functionality of a set-top box. That is, the electronic device 30 is structured to receive, process and output video and audio signals such as, without limitation, a cable television signal.

The electronic device 30 includes a line power interface 32 structured to electrically connect to a power source (e.g., without limitation, LINE power) via a busbar or other suitable electrical connection mechanism. The electronic device 30 also includes audio and/or video interfaces 34 structured to receive a data connection such as an audio and/or video data connection. The audio and/or video interfaces 34 may include any suitable video input and output interfaces such as, for example and without limitation, coaxial, high-definition multimedia interface (HDMI), composite video or any other suitable type of audio and/or video interface.

The electronic device 30 further includes a power supply 36, a processor 38, a storage unit 40, a wireless communication unit 42 and an antenna 44. The power supply 36 is structured to receive power via the line power interface 32 and to convert it to a type and level suitable for use by components of the electronic device 30. For example and without limitation, the power supply 36 may include an AC/DC converter structured to convert AC line power to DC power usable by components such as the processor 38.

The processor 38 may be, for example and without limitation, a microprocessor, a microcontroller, or some other suitable processing device or circuitry, that interfaces with a memory such as the storage unit 40 or another suitable memory. The processor 38 is structured to control operations of the electronic device 30. For example and without limitation, the processor 38 may perform processing on an input audio and/or video signal before outputting the audio and/or video signal. Additionally, the processor 38 may perform functions that would typically be performed by a set-top box.

The storage unit 40 may be any of one or more of a variety of types of internal and/or external storage media such as, without limitation, RAM, ROM, EPROM(s), EEPROM(s), FLASH, and the like that provide a storage register, i.e., a machine readable medium, for data storage such as in the fashion of an internal storage area of a computer, and can be volatile memory or nonvolatile memory.

The wireless communication unit 42 is structured to wirelessly communicate with external devices such as, for example and without limitation, a computer, a tablet, a mobile phone, a cable provider's backend system or any other suitable type of device. The wireless communication unit may wirelessly communicate using any suitable communication protocol such as, for example and without limitation, cellular, wi-fi, Bluetooth, Zigbee, Z-wave or any other suitable wireless communication protocol. The antenna 44 is associated with the wireless communication unit 42 to facilitate wireless communication.

The electronic device 30 further includes an interface area 46. The interface area 46 may include one or more of indicator lights or a display structured to provide indication of the status of the electronic device 30. The interface area 46 may also include buttons or other interactive elements that allow a user to control aspects of the electronic device 30.

The electronic device 30 has a housing 48 that substantially defines the exterior shape of the electronic device 30 and its form factor. The form factor of the electronic device 30 may be a particular form factor that is compatible with the positions 8 of the load center 1 of FIG. 1 and is substantially similar to the form factor of the circuit breaker 10 of FIG. 2. Although one example of a particular form factor is shown, it will be appreciated that the electronic device 30 may have any suitable form factor without departing from the scope of the disclosed concept.

Figure 4:
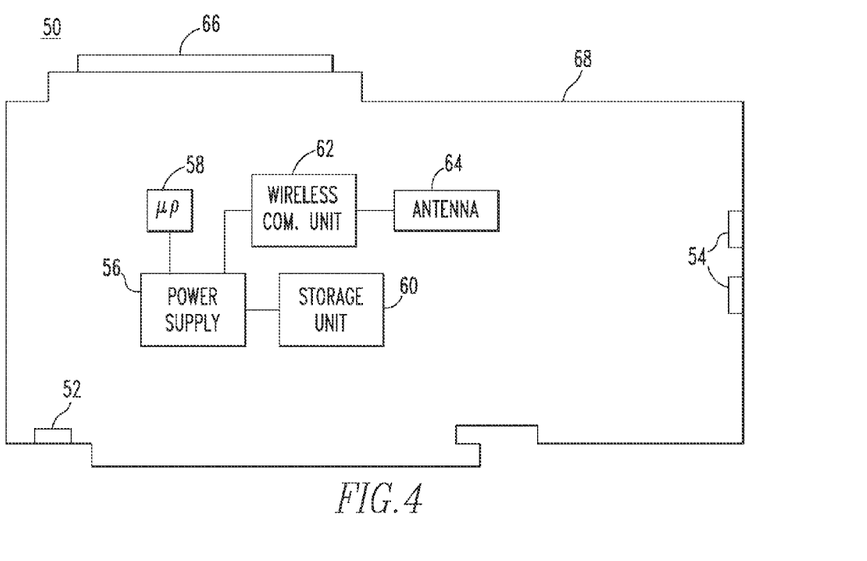

FIG. 4 is a schematic diagram of an electronic device 50 in accordance with another example embodiment of the disclosed concept. The electronic device 50 of FIG. 4 is structured to provide functionality of a network data interface (e.g., without limitation, a router). That is, the electronic device 50 is structured to provide data routing for a network such as a local area network (LAN) or a wide area network (WAN). It is contemplated that the electronic device 50 may service wired networks, wireless networks or both.

The electronic device 50 includes a line power interface 52, a power supply 56, a storage unit 60, a wireless communication unit 62, an antenna 64 and an interface area 66 which operate similar to the line power interface 32, the power supply 36, the storage unit 40, the wireless communication unit 42, the antenna 44 and the interface area 46 of the electronic device 30 of FIG. 3. Therefore, further description of these components is omitted.

The electronic device 50 includes network interfaces 54. The network interfaces 54 may include any suitable type of network interface such as, for example and without limitation, RJ-45, FireWire, universal serial bus (USB) or any other suitable type of network interface.

The electronic device 50 further includes a processor 58. The processor 58 may be, for example and without limitation, a microprocessor, a microcontroller, or some other suitable processing device or circuitry, that interfaces with a memory such as the storage unit 60 or another suitable memory. The processor 58 is structured to control operations of the electronic device 50. For example and without limitation, the processor 58 may perform functions that would typically be performed by a network data interface. It is also contemplated that the processor 58 may control the wireless communication unit 62 to receive and send signals over a wireless network.

The electronic device 50 has a housing 68 that substantially defines the exterior shape of the electronic device 50 and its form factor. The form factor of the electronic device 50 may be a particular form factor that is compatible with the positions 8 of the load center 1 of FIG. 1 and is substantially similar to the form factor of the circuit breaker 10 of FIG. 2. Although one example of a particular form factor is shown, it will be appreciated that the electronic device 50 may have any suitable form factor without departing from the scope of the disclosed concept.

Figure 5:
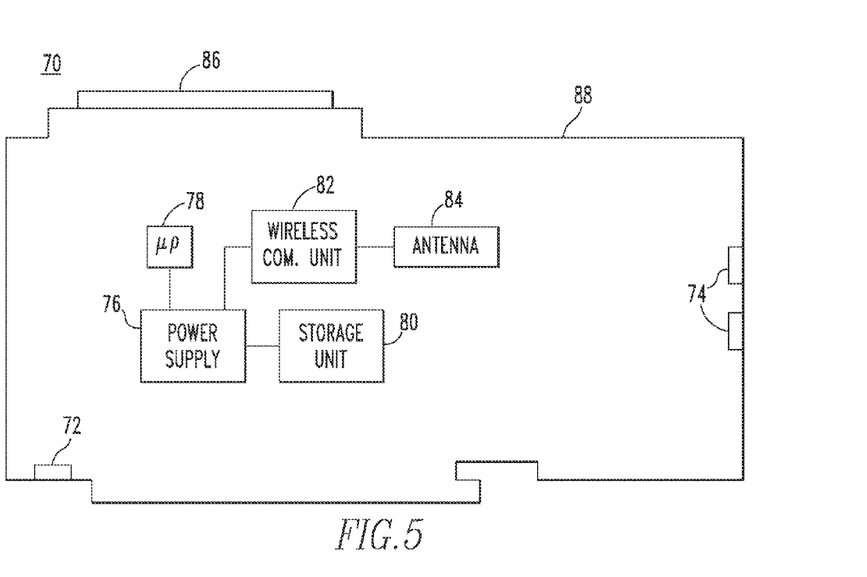

FIG. 5 is a schematic diagram of an electronic device 70 in accordance with another example embodiment of the disclosed concept. The electronic device 70 of FIG. 5 is structured to provide functionality of a telephone base station. That is, the electronic device 70 is structured to serve as the entry point of a telephone line to a residence or other type of premises.

The electronic device 70 includes a line power interface 72, a power supply 76, a storage unit 80, a wireless communication unit 82, an antenna 84 and an interface area 86 which operate similar to the line power interface 32, the power supply 36, the storage unit 40, the wireless communication unit 42, the antenna 44 and the interface area 46 of the electronic device 30 of FIG. 3. Therefore, further description of these components is omitted.

The electronic device 70 includes telephone interfaces 74. The network interfaces 54 may include any suitable type of network interface such as, for example and without limitation, RJ-11, or any other suitable type of telephone interface.

The electronic device 70 further includes a processor 78. The processor 78 may be, for example and without limitation, a microprocessor, a microcontroller, or some other suitable processing device or circuitry, that interfaces with a memory such as the storage unit 80 or another suitable memory. The processor 78 is structured to control operations of the electronic device 70. For example and without limitation, the processor 78 may perform functions that would typically be performed by a telephone base station. It is also contemplated that the processor 78 may control the wireless communication unit 82 to receive and send signals to associated wireless telephones.

The electronic device 70 has a housing 88 that substantially defines the exterior shape of the electronic device 70 and its form factor. The form factor of the electronic device 70 may be a particular form factor that is compatible with the positions 8 of the load center 1 of FIG. 1 and is substantially similar to the form factor of the circuit breaker 10 of FIG. 2. Although one example of a particular form factor is shown, it will be appreciated that the electronic device 70 may have any suitable form factor without departing from the scope of the disclosed concept.

Figure 6:
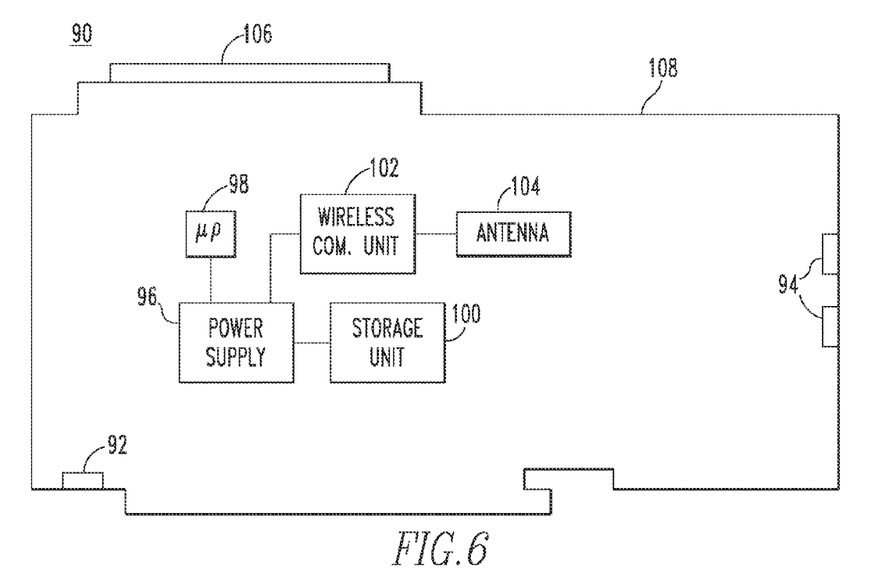

FIG. 6 is a schematic diagram of an electronic device 90 in accordance with another example embodiment of the disclosed concept. The electronic device 90 of FIG. 6 is structured to provide functionality of a security system hub. That is, the electronic device 90 may receive and send signals to elements associated with a security system as well as initiate alarms or notify external parties of security events.

The electronic device 90 includes a line power interface 92, a power supply 96, a storage unit 100, a wireless communication unit 102, an antenna 104 and an interface area 106 which operate similar to the line power interface 32, the power supply 36, the storage unit 40, the wireless communication unit 42, the antenna 44 and the interface area 46 of the electronic device 30 of FIG. 3. Therefore, further description of these components is omitted.

The electronic device 90 includes security system interfaces 94. The security system interfaces 94 may include any suitable type of interface used by the security system. Although two security system interfaces 94 are illustrated, it is contemplated that any number of security system interfaces 94 may be employed without departing from the scope of the disclosed concept.

The electronic device 90 may communicate with elements of a security system such as, without limitation, door sensors, motions sensors, etc. via a wired connection through security system interfaces 94. It is also contemplated that the electronic device 90 may communicate with elements of the security system via a wireless connection using the wireless communication unit 102.

The electronic device 90 further includes a processor 98. The processor 98 may be, for example and without limitation, a microprocessor, a microcontroller, or some other suitable processing device or circuitry, that interfaces with a memory such as the storage unit 100 or another suitable memory. The processor 98 is structured to control operations of the electronic device 90. For example and without limitation, the processor 98 may perform functions that would typically be performed by a security system hub.

The electronic device 90 has a housing 108 that substantially defines the exterior shape of the electronic device 90 and its form factor. The form factor of the electronic device 90 may be a particular form factor that is compatible with the positions 8 of the load center 1 of FIG. 1 and is substantially similar to the form factor of the circuit breaker 10 of FIG. 2. Although one example of a particular form factor is shown, it will be appreciated that the electronic device 90 may have any suitable form factor without departing from the scope of the disclosed concept.

Figure 7:
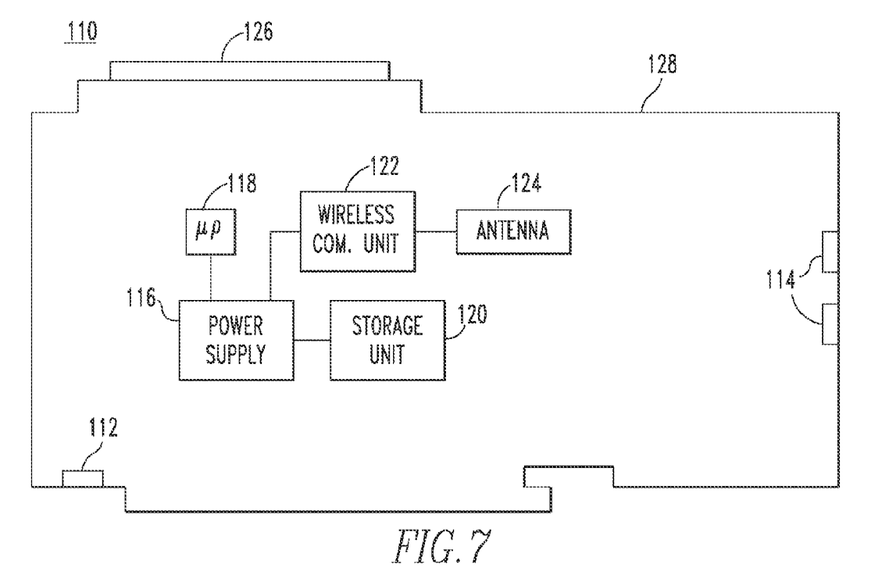

FIG. 7 is a schematic diagram of an electronic device 110 in accordance with another example embodiment of the disclosed concept. The electronic device 110 of FIG. 7 is structured to provide functionality of a home controller. That is, the electronic device 110 is structured to communicate with various devices around a home such as, for example and without limitation, lights, media devices, wiring devices including receptacles, switches and dimmers, blinds or shades, door locks or other types of devices to allow a user to control devices around the home via the electronic device 110. It is contemplated that the user may control the electronic device 110 via a wireless device such as a tablet or a mobile phone.

The electronic device 110 includes a line power interface 112, a power supply 116, a storage unit 120, a wireless communication unit 122, an antenna 124 and an interface area 126 which operate similar to the line power interface 32, the power supply 36, the storage unit 40, the wireless communication unit 42, the antenna 44 and the interface area 46 of the electronic device 30 of FIG. 3. Therefore, further description of these components is omitted.

The electronic device 110 includes home controller interfaces 114. The home controller interfaces 114 may include any suitable type of wired interface for communication with devices around the home. It is also contemplated that the electronic device 110 may use the wireless communication unit 122 to wirelessly communicate with devices around the home.

The electronic device 110 further includes a processor 118. The processor 118 may be, for example and without limitation, a microprocessor, a microcontroller, or some other suitable processing device or circuitry, that interfaces with a memory such as the storage unit 120 or another suitable memory. The processor 118 is structured to control operations of the electronic device 110. For example and without limitation, the processor 118 may perform functions that would typically be performed by a home controller.

The electronic device 110 has a housing 128 that substantially defines the exterior shape of the electronic device 110 and its form factor. The form factor of the electronic device 110 may be a particular form factor that is compatible with the positions 8 of the load center 1 of FIG. 1 and is substantially similar to the form factor of the circuit breaker 10 of FIG. 2. Although one example of a particular form factor is shown, it will be appreciated that the electronic device 110 may have any suitable form factor without departing from the scope of the disclosed concept.

While the schematic diagrams of the electronic devices 30, 50, 70, 90, 110 of FIGS. 3-7 illustrate some example components that may be included in the electronic devices 30, 50, 70, 90, 110, it is contemplated that other configurations of the electronic devices 30, 50, 70, 90, 110 may also suitably provide a similar functionality. It is therefore contemplated that components of the electronic devices 30, 50, 70, 90, 110 may be added, removed or modified without departing from the scope of the disclosed concept. It is also contemplated that the electronic devices 30, 50, 70, 90, 110 may include a power line communication unit capable of providing a power line communication functionality without departing from the scope of the disclosed concept.

Figure 8:
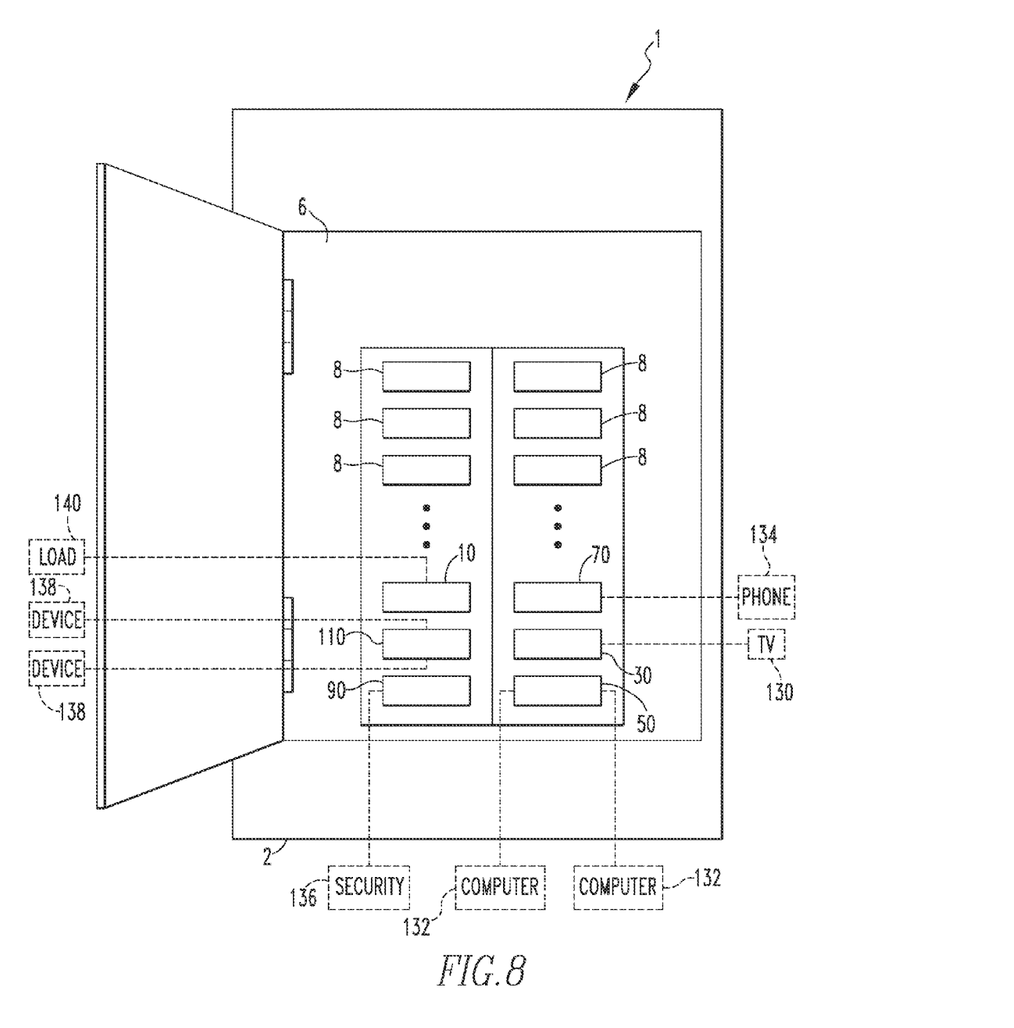
FIG. 8 is a schematic diagram of the load center of FIG. 1 including an installed assortment of circuit breakers and electronic devices.

FIG. 8 is a schematic diagram of the load center 1 of FIG. 1 including an installed assortment of circuit breakers 10 and electronic devices 30, 50, 70, 90, 110 in accordance with an example embodiment of the disclosed concept.

Each of the positions 8 in the circuit breaker receiving area 6 are compatible with a particular form factor. The circuit breaker 10 and the electronic devices 30, 50, 70, 90, 110 installed in the positions 8 all have substantially the same particular form factor that is compatible with the positions 8, and thus may be installed in the positions 8. The electronic devices 30, 50, 70, 90, 110 may interact with various devices around a home such as, for example and without limitation, a television 130, a computer 132, a telephone 134, a security system element 136 and devices 138 associated with a home controller. The circuit breaker 10 may provide protection to a load 140 such as, for example and without limitation, heating or air conditioning units, appliances, electric vehicle equipment or other devices that use power.

The load center 1 including both installed circuit breakers 10 and electronic devices 30, 50, 70, 90, 110 provides enhanced functionality compared to prior load centers which only dealt with power distribution. It will be appreciated by those having ordinary skill in the art that any assortment of electronic devices 30, 50, 70, 90, 110 may be installed in the load center 1 without departing from the scope of the disclosed concept.

It is contemplated that in some example embodiments of the disclosed concept, only a selection of one or more of the electronic devices 30, 50, 70, 90, 110 are installed in the load center 1. That is, no circuit breakers 10 are installed in the load center 1. In other example embodiments of the disclosed concept, both a selection of one or more of the electronic devices 30, 50, 70, 90, 110 and one or more circuit breakers 10 are installed in the load center 1.

In some example embodiments of the disclosed concept, the circuit breakers 10 and electronic devices 30, 50, 70, 90, 110 may communicate with each other via wired connections or wireless connections.

It will be appreciated that in some example embodiments of the disclosed concept, a circuit breaker or electronic device may use multiple positions in a load center. For example, a circuit breaker or electronic device may fit into two adjacent positions in the load center simultaneously. It will be appreciated by those having ordinary skill in the art that circuit breakers or electronic devices that use multiple positions in a load center may be employed without departing from the scope of the disclosed concept.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An electronic device comprising:
   a housing defining an exterior shape of the electronic device;
   a processor;
   a power supply structured to receive line power and to convert the line power for use by the electronic device;
   a storage unit structured to store data; and
   a number of data interfaces structured to receive a data connection,
   wherein the electronic device has a particular form factor that is compatible with positions in a circuit breaker receiving area of a load center, and
   wherein the electronic device is structured to provide the functionality of at least one of a set-top box, a network data interface, a telephone base station, a security system hub and a home controller.

2. The electronic device of claim 1, further comprising:
   a wireless communication unit structured to wirelessly communicate with one or more external devices.

3. The electronic device of claim 2, wherein the one or more external devices include at least one of a computer, a tablet and a mobile phone.

4. The electronic device of claim 2, wherein the wireless communication unit is structured to communicate using at least one of cellular, wi-fi, Bluetooth, Zigbee or Z-wave protocols.

5. The electronic device of claim 1, wherein the electronic device is structured to provide the functionality of a set-top box, and wherein the number of data interfaces are audio and video interfaces including at least one of coaxial, high-definition multimedia interface and composite video.

6. The electronic device of claim 1, wherein the electronic device is structured to provide the functionality of a network data interface, and wherein the number of data interfaces are network interfaces.

7. The electronic device of claim 1, wherein the electronic device is structured to provide the functionality of a telephone base station, and wherein the number of data interfaces are telephone interfaces.

8. The electronic device of claim 1, wherein the electronic device is structured to provide the functionality of a security system hub, and wherein the number of data interfaces are security system interfaces structured to connect to components of a security system.

9. The electronic device of claim 1, wherein the electronic device is structured to provide the functionality of a home controller, and wherein the number of data interfaces are home controller interfaces structured to connect to devices around a home.

10. The electronic device of claim 1, wherein the power supply is structured to convert alternating current power to direct current power.

11. The electronic device of claim 1, further comprising:
an interface area including one or more of indicator lights and a display and being structured to provide indication of a status of the electronic device.

12. A load center comprising:
a circuit breaker receiving area including a number of positions structured to be compatible with devices having a particular form factor; and
a number of electronic devices having the particular form factor and being installed in at least one of the number of positions,
wherein each of the electronic devices provide functionality of at least one of a set-top box, a network data interface, a telephone base station, a security system hub and a home controller.

13. The load center of claim 12, further comprising:
a number of circuit breakers having the particular form factor and being installed in at least one of the number of positions.

14. The load center of claim 12, wherein at least one of the number of electronic devices includes:
a housing defining an exterior shape of the at least one electronic device;
a processor;
a power supply structured to receive line power and to convert the line power for use by the at least one electronic device;
a storage unit structured to store data; and
a number of data interfaces structured to receive a data connection.

15. The load center of claim 14, wherein the at least one electronic device further includes:
a wireless communication unit structured to wirelessly communicate with one or more external devices.

16. The load center of claim 15, wherein the one or more external devices include at least one of a computer, a tablet and a mobile phone.

17. The load center device of claim 15, wherein the wireless communication unit is structured to communicate using at least one of cellular, wi-fi, Bluetooth, Zigbee or Z-wave protocols.

18. The load center of claim 14, wherein the power supply is structured to convert alternating current power to direct current power.

19. The load center of claim 14, wherein the at least one electronic device further includes:
an interface area including one or more of indicator lights and a display and being structured to provide indication of a status of the electronic device.

* * * * *